(12) United States Patent
Jung

(10) Patent No.: US 8,133,818 B2
(45) Date of Patent: Mar. 13, 2012

(54) METHOD OF FORMING A HARD MASK PATTERN IN A SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 823 days.

(21) Appl. No.: 12/132,620

(22) Filed: Jun. 4, 2008

(65) Prior Publication Data

US 2009/0142932 A1    Jun. 4, 2009

(30) Foreign Application Priority Data

Nov. 29, 2007   (KR) .................. 10-2007-0122648

(51) Int. Cl.
*H01L 21/302* (2006.01)
*B44C 1/22* (2006.01)

(52) U.S. Cl. .......... 438/717; 438/706; 438/718; 216/58; 216/41; 216/47; 430/312

(58) Field of Classification Search .................. 438/706, 438/717, 718; 216/58, 41, 47; 430/312
See application file for complete search history.

(56) References Cited

U.S. PATENT DOCUMENTS

| 7,892,977 B2 * | 2/2011 | Jung ........................... 438/694 |
| 2006/0240361 A1 | 10/2006 | Lee et al. |
| 2008/0113511 A1 * | 5/2008 | Park et al. ..................... 438/692 |

FOREIGN PATENT DOCUMENTS

| CN | 1332472 | | 1/2002 |
| JP | 2006-190952 | | 7/2006 |
| KR | 1020040104417 | A | 12/2004 |
| KR | 10-0574999 | * | 4/2006 |
| KR | 100595328 | B1 | 6/2006 |
| KR | 100734464 | B1 | 6/2007 |

* cited by examiner

*Primary Examiner* — Shamim Ahmed
(74) *Attorney, Agent, or Firm* — Kilpatrick Townsend & Stockton LLP

(57) ABSTRACT

In a method of forming a hard mask pattern in a semiconductor device, only processes for forming patterns having a row directional line shape and a column directional line shape on a plane are performed so that the hard mask patterns can be formed to define densely disposed active regions. A pitch of the hard mask patterns is less than a resolution limit of an exposure apparatus.

21 Claims, 12 Drawing Sheets

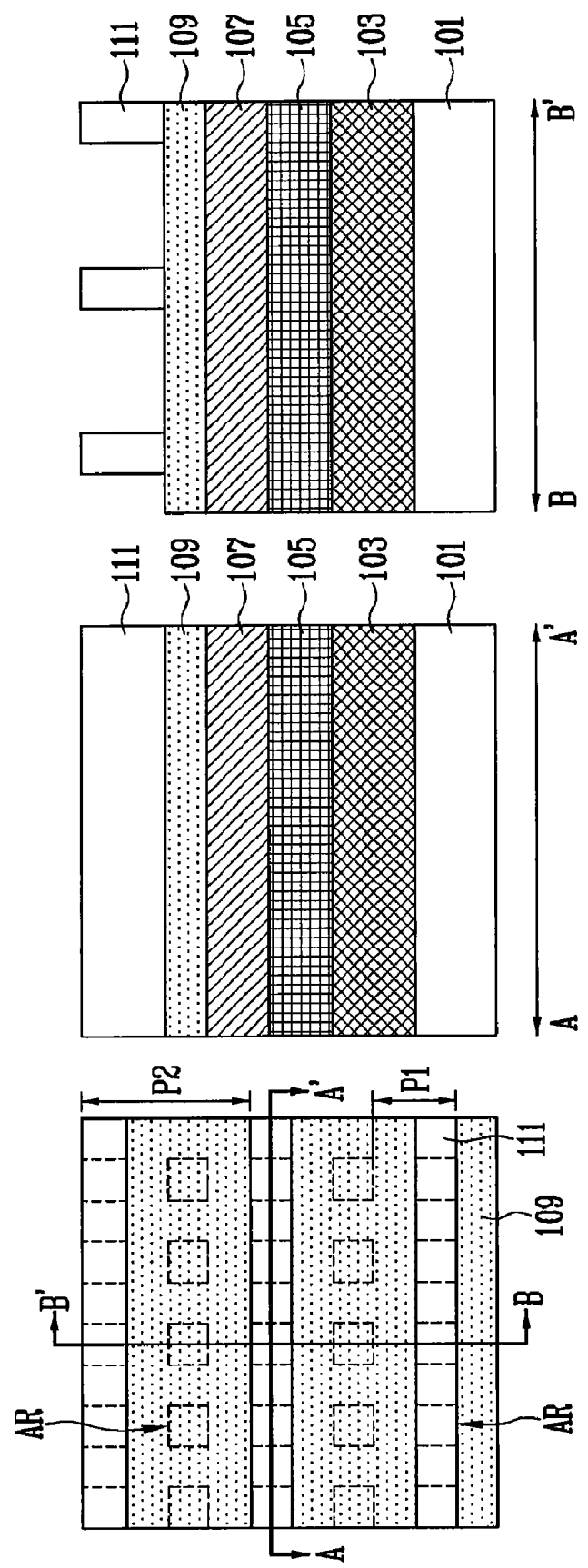

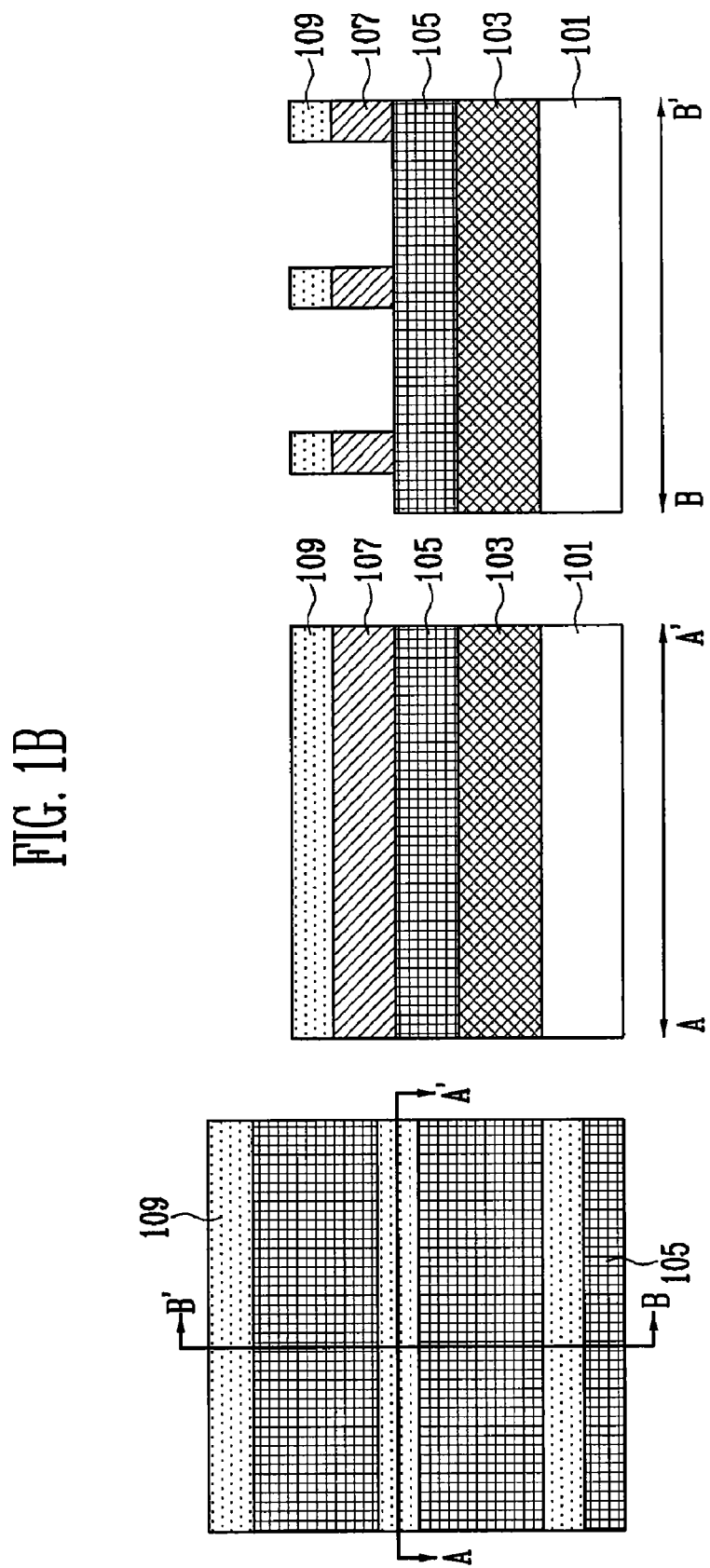

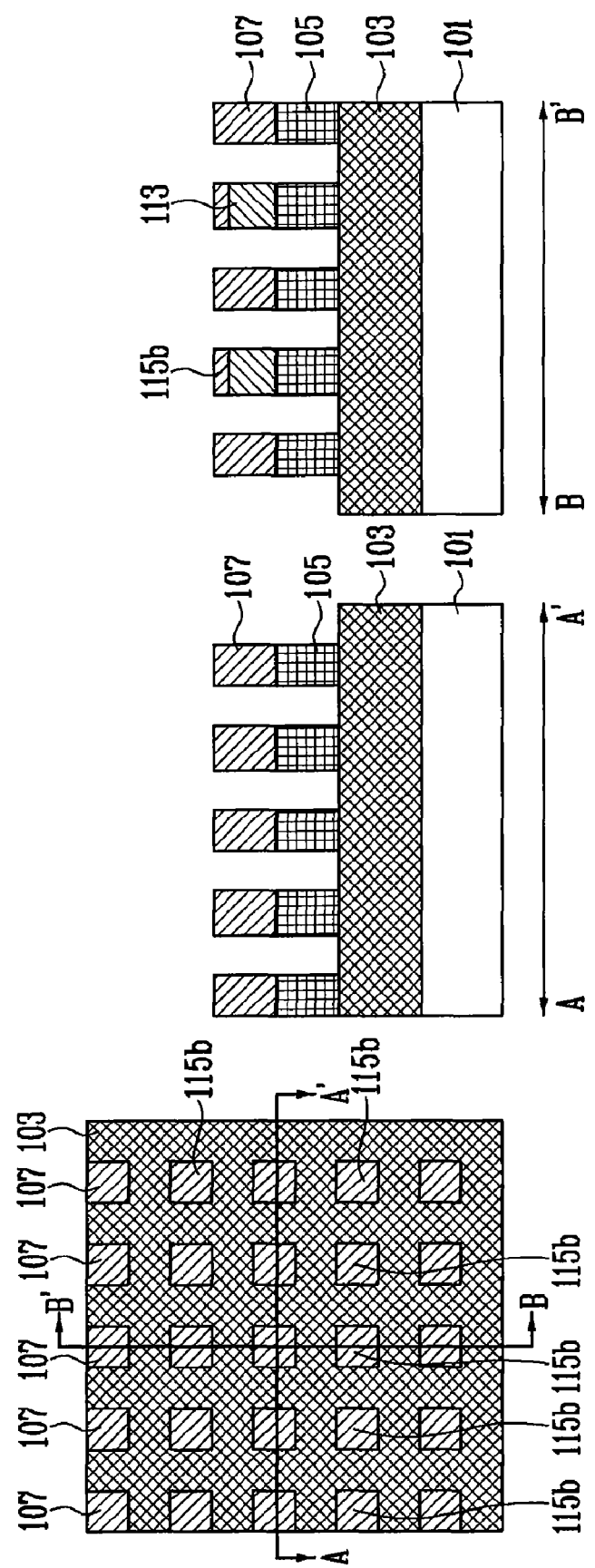

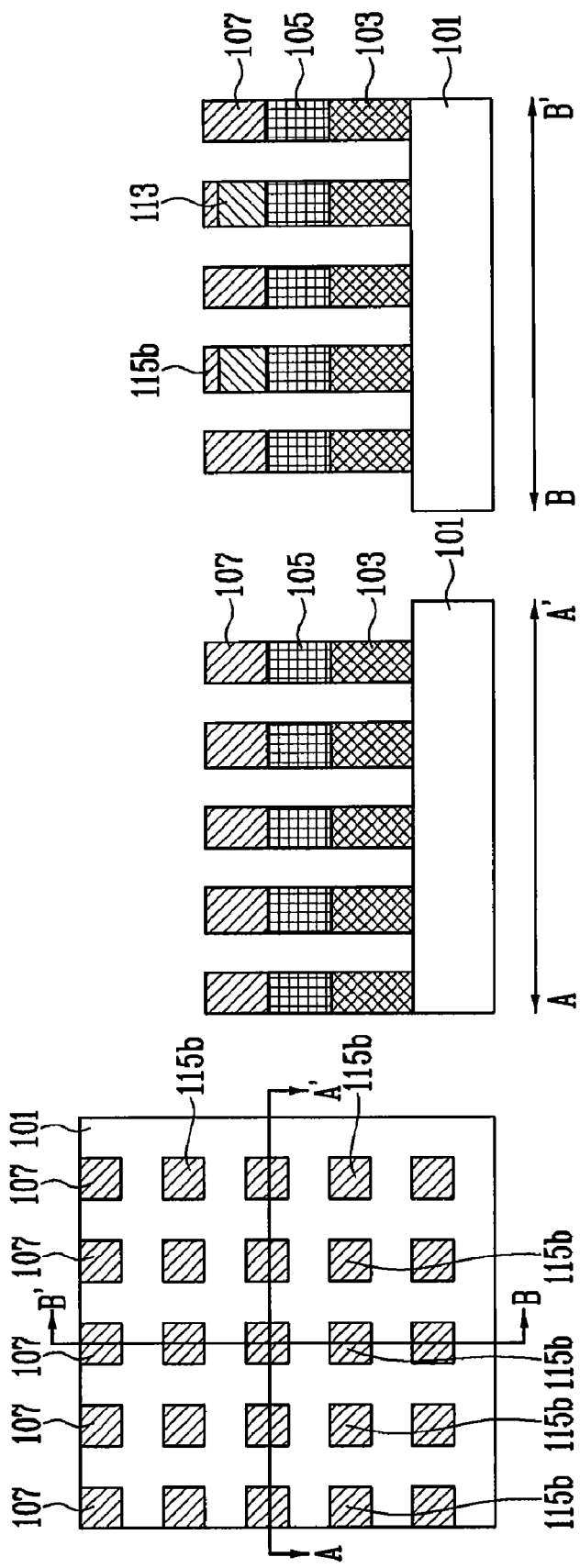

METHOD OF FORMING A HARD MASK PATTERN IN A SEMICONDUCTOR DEVICE

CROSS-REFERENCE TO RELATED APPLICATIONS

This application claims priority from Korean Patent Application No. 10-2007-0122648, filed on Nov. 29, 2007, the contents of which are incorporated herein by reference in its entirety.

BACKGROUND OF THE INVENTION

The present invention relates to a hard mask pattern in a semiconductor device and a method of forming the same and, more particularly, to a hard mask pattern in a semiconductor device and a method of forming the same for defining a plurality of active regions arranged in a matrix.

On a semiconductor substrate, a plurality of semiconductor elements such as transistors are formed that are electrically connected by metal wire. The metal wire and a junction area (for example, a source or a drain of the transistor) of the semiconductor substrate are electrically connected to each other via a contact plug.

In a dynamic random access memory (DRAM) device, a transistor is formed on the semiconductor substrate, and a storage node contact plug is formed. Prior to forming the contact plug, an interlayer insulating layer is formed and a contact hole is then formed in the interlayer insulating layer. The DRAM device is classified into various devices according to an arrangement of the transistor and a capacitor. In the 4F2 DRAM device, active regions are arranged in a matrix in a cell area. In particular, the active region is formed with a quadrangle shape (more particularly, a square shape). As integration of the device increases, a size of the active region or a distance between the active regions in the 4F2 DRAM device is less than a limitation of resolution of exposure equipment. Thus, when a process of forming the photoresist pattern for defining the active region is performed, an exposure process for the photoresist layer is carried out twice. Due to the above restriction, manufacturing costs are increased and it is difficult to reduce a resolution index (k1) below 0.20.

SUMMARY OF THE INVENTION

In a method of forming a hard mask pattern of a semiconductor device disclosed in the present invention, only processes for forming patterns having a row directional line shape and a column directional line shape on a plane are performed to form the hard mask patterns for defining densely disposed active regions. The hard mask patterns are formed with a pitch which is less than a resolution of an exposure apparatus.

A method of forming a hard mask pattern in a semiconductor device is disclosed in embodiments of the present invention. The method includes forming a hard mask layer on a semiconductor substrate. First etching mask patterns are formed on the hard mask layer. Second etching mask patterns are formed and include first patterns and second patterns. The first patterns intersect the first etching mask pattern and each second etching mask pattern is disposed between the first etching mask patterns. Third etching mask patterns are formed and each third etching mask pattern is disposed between the first patterns. A first etching process is performed such that the first etching mask patterns remain on regions at which the first patterns intersect the first etching mask patterns and the second patterns remain on regions at which the first patterns intersect the second patterns. The hard mask layer is patterned through a second etching process utilizing the remaining first etching mask patterns and the second patterns as the etching mask to form hard mask patterns.

In the above method, it is preferable that the first, second and third etching mask patterns are formed from the same material. For example, the first, second and the third etching mask patterns can be formed of a bottom anti-reflection coating (BARC) layer containing silicon (Si). The first, second and third etching mask patterns are separately formed on different layers, and the first patterns and the second patterns of the second etching mask pattern are also formed on different layers.

The step of forming the second etching mask patterns includes forming a first auxiliary layer with a thickness sufficient to maintain a stepped portion formed by the first etching mask patterns. An etching mask layer is formed on the first auxiliary layer to fill a space between the first auxiliary patterns formed by the stepped portion. A patterning process is performed such that the etching mask layer remains in the space between the first auxiliary layers and the second etching mask layer intersects the first hard mask patterns and remains on the first auxiliary layer to form the first and second patterns. The first auxiliary layer is formed from carbon polymer. An anti-reflection layer can be further formed on the etching mask layer. A distance between the first etching mask pattern and the second pattern is determined by a thickness of the first auxiliary layer.

The step of forming the third etching mask patterns includes forming a second auxiliary layer with a thickness sufficient to maintain a stepped portion formed by the second etching mask patterns. An etching mask layer is formed on the second auxiliary layer to fill a space between the second auxiliary patterns formed by the stepped portion. A patterning process is performed such that the etching mask layer remains in the space between the second auxiliary layers to form the third hard mask patterns. The second auxiliary layer may be formed from carbon polymer. A distance between the first pattern and the third hard mask pattern is determined by a thickness of the second auxiliary layer.

The regions on which the hard mask patterns remain may be defined as active regions. In this case, the first etching mask patterns are formed parallel to each other on the active regions located at odd-numbered or even-numbered columns or rows in the active regions.

The first etching mask patterns have a pitch which is approximately twice as large as a pitch between the active regions, the first patterns have a pitch which is approximately twice as large as a pitch between the active regions, the second patterns have a pitch which is approximately twice as large as a pitch between the active regions, and the third hard mask patterns have a pitch which is approximately twice as large as a pitch between the active regions. The first, second and third etching mask patterns may be formed in the same chamber in an in-situ manner.

The third etching mask patterns and the first patterns are removed by a first etching process.

BRIEF DESCRIPTION OF THE DRAWINGS

The above and other features and advantages of the present invention will become readily apparent by reference to the following detailed description when considered in conjunction with the accompanying drawings wherein:

FIG. 1A to FIG. 1L are views for illustrating a method of forming a hard mask pattern in a semiconductor device according to an embodiment of the present invention.

DESCRIPTION OF SPECIFIC EMBODIMENTS

Figure 1C:
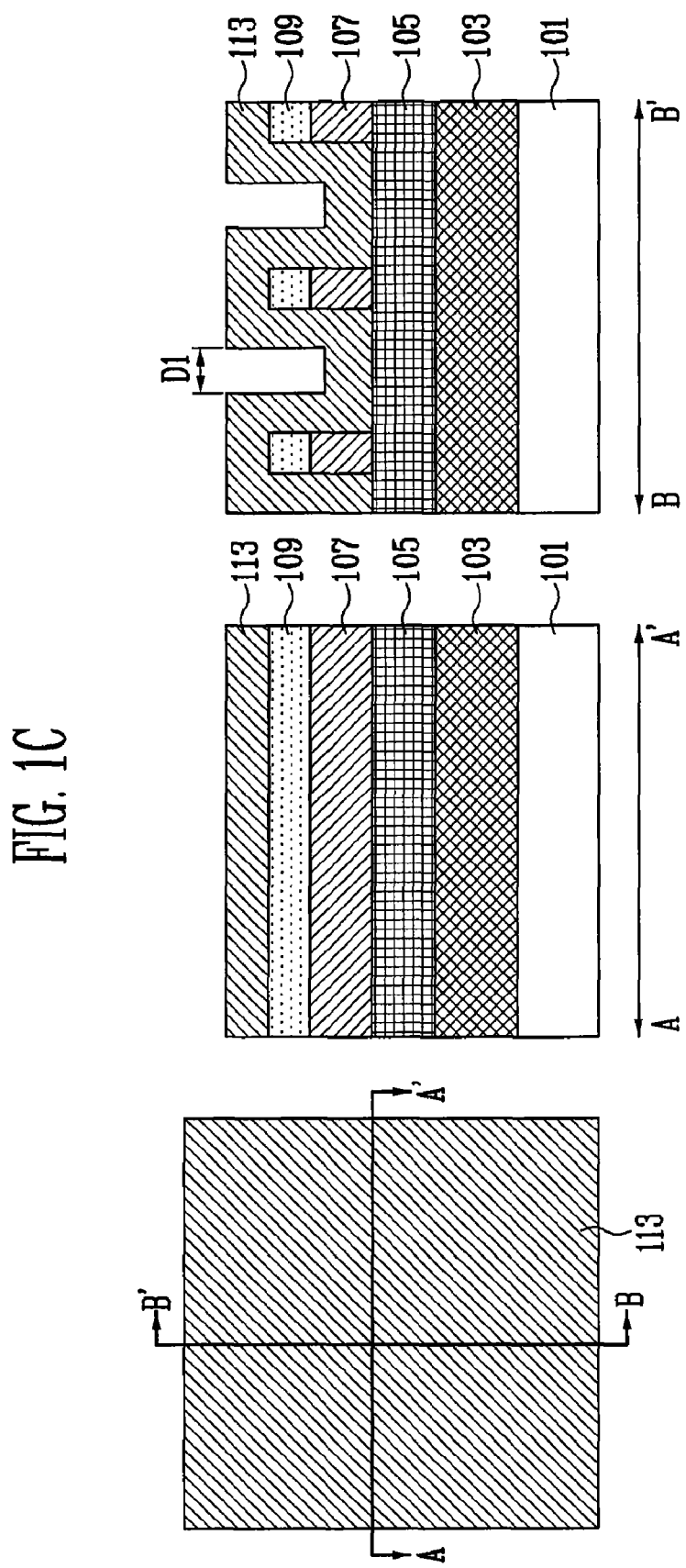

Hereinafter, embodiments of the present invention will be explained in detail with reference to the accompanying drawings.

In the below description, the expression "any layer is formed 'on' another layer or a substrate layer" means that any layer can be in contact directly with another layer or a semiconductor substrate or a third layer may be interposed between any layer and the another layer or a semiconductor substrate. Further, in the drawings, a thickness and a size of each layer are exaggerated for convenience and clarity of the description. Also, same reference numerals designate the same elements in the drawings.

FIG. 1A to FIG. 1L are views for illustrating a method of forming a hard mask pattern in a semiconductor device according to an embodiment of the present invention.

Referring to FIG. 1A, a hard mask layer 103 is formed on a semiconductor substrate 101. The hard mask layer 103 can be formed of a nitride layer or a stack structure consisting of an oxide layer and a nitride layer. In a patterning process for defining an active region, a first etching mask layer 105, a second etching mask layer 107 and a first anti-reflection layer 109 are sequentially formed on the hard mask layer 103 using the hard mask layer 103 as an etching mask. First photoresist patterns 111 are formed on the first anti-reflection layer 109.

The active regions are arranged in a matrix and a hard mask pattern is formed for defining such active regions (i.e., the hard mask pattern is formed in a matrix). The hard mask pattern arranged in a matrix can be utilized for defining an active region in a process for manufacturing the 4F2 DRAM. In this case, the hard mask pattern may be used as an isolation mask in an etching process performed for etching a semiconductor substrate of an isolation area.

The first etching mask layer 105 can be formed of a SOC (spin on carbon) layer, the second etching mask layer 107 can be formed of a bottom anti-reflection coating (BARC) layer containing silicon (Si) and the first anti-reflection layer 109 may be formed of a carbon layer. The first anti-reflection layer 109 prevents a deterioration of the exposure characteristic caused by a diffused reflection in a process of forming the first photoresist patterns 111. If the second etching mask layer 107 can prevent the diffused reflection from being generated, the formation of the first anti-reflection layer 109 may be omitted.

The first photoresist patterns 111 are formed parallel to each other. In the 4F2 DRAM device, for example, the first photoresist patterns are formed parallel to each other on active regions AR located at odd-numbered (or even-numbered) columns (or rows). A pitch P2 between the first photoresist patterns 111 is approximately twice as large as a pitch P1 between the active regions AR.

Referring to FIG. 1B, the first anti-reflection layer 109 and the second etching mask layer 107 are patterned through an etching process using the first photoresist patterns 111 to form second etching mask patterns 107. In accordance with a shape of the first photoresist pattern 111, the second etching mask patterns 107 are formed parallel to each other on the active regions AR located at odd-numbered (or even-numbered) columns (or rows). A pitch P2 between the second etching mask patterns 107 is approximately twice as large as the pitch P1 between the active regions AR. A portion of the first etching mask layer 105 is exposed between the first etching mask patterns 107. The first photoresist patterns 111 are then removed.

Referring to FIG. 1C, a first auxiliary layer 113 is formed on the semiconductor substrate 101 including an exposed area of the first etching mask layer 105. It is preferable that the first auxiliary layer 113 is formed from carbon polymer.

The first auxiliary layer 113 has a thickness sufficient to maintain a step formed by the second etching mask patterns 107. In particular, since a thickness of the first auxiliary layer 113 formed on a side wall of the second etching mask patterns 107 determines a distance between the active regions in a subsequent process, it is preferable to adjust a thickness of the first auxiliary layer 113 according to a distance between the active regions. According to the first auxiliary layer 113 having a thickness sufficient to maintain the step, a step such as a trench corresponding to a width of the active region AR is formed in the first auxiliary layer 113 between the second etching mask patterns 107. That is, a distance D1 between the opposite side walls of the first auxiliary layer 113 becomes a width of the active region.

Figure 1D:
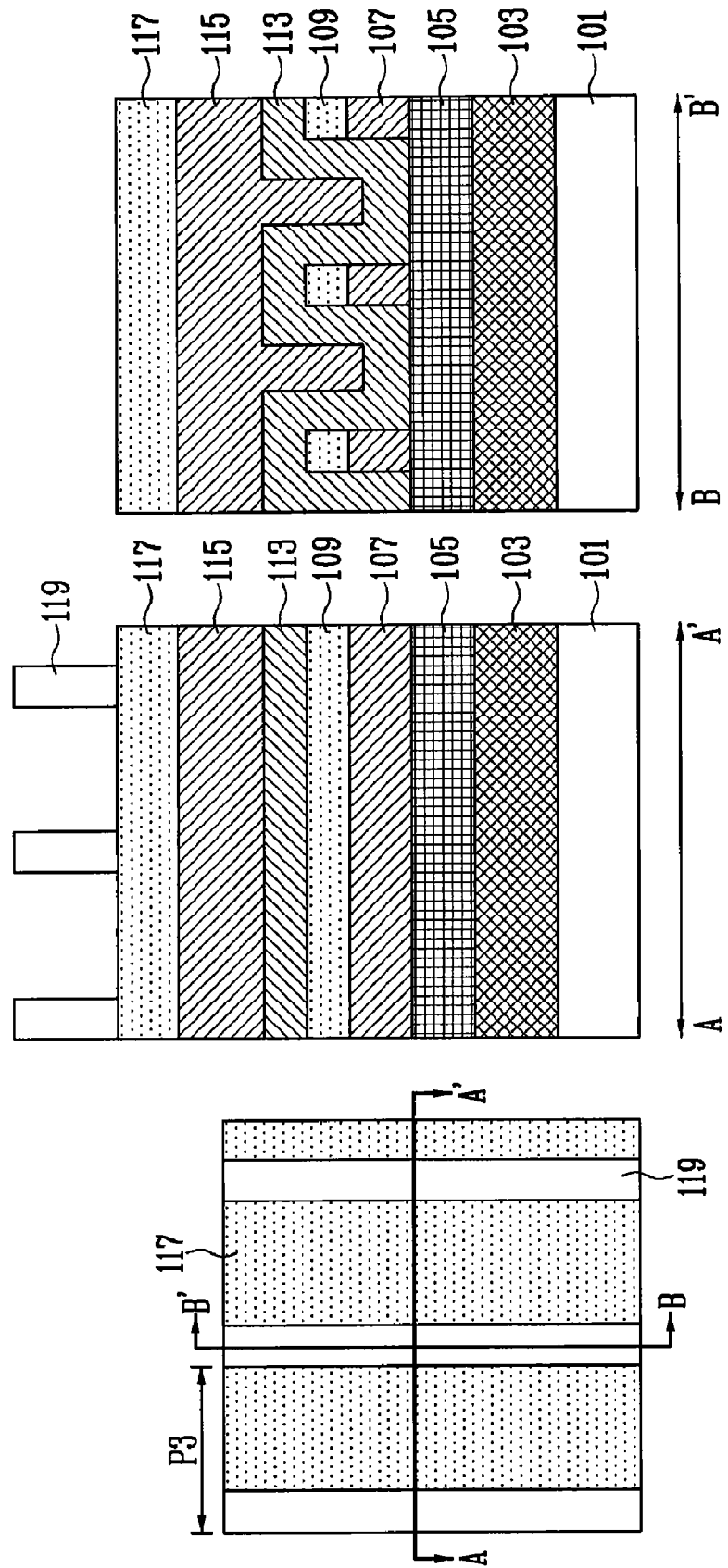

Referring to FIG. 1D, a third etching mask layer 115 is formed on the first auxiliary layer 113 to fill a space between the first auxiliary layers 113. A second anti-reflection layer 117 is formed on the third etching mask layer 115. Second photoresist patterns 119 are formed on the second anti-reflection layer 117.

To facilitate a subsequent process, it is preferable that the third etching mask layer 115 is formed from material which is the same as that used for forming the second hard mask pattern 107. That is, the third etching mask layer 115 may be formed of a BARC (bottom anti-reflection coating) layer containing silicon (Si). Like the above description regarding FIG. 1A, if the third etching mask layer 115 can prevent the diffused reflection from being generated during an exposure process for forming the second photoresist patterns 119, the formation of the second anti-reflection layer 117 may be omitted.

The second photoresist patterns 119 are formed parallel to each other in a direction perpendicular to the first photoresist patterns (111 in FIG. 1A). In the 4F2 DRAM device, for example, the second photoresist patterns 119 are formed parallel to each other in a direction perpendicular to the first photoresist patterns (111 in FIG. 1A) between the active regions AR. A pitch P3 between the second photoresist patterns 119 is approximately twice as large as the pitch P1 between the active regions AR.

Figure 1E:
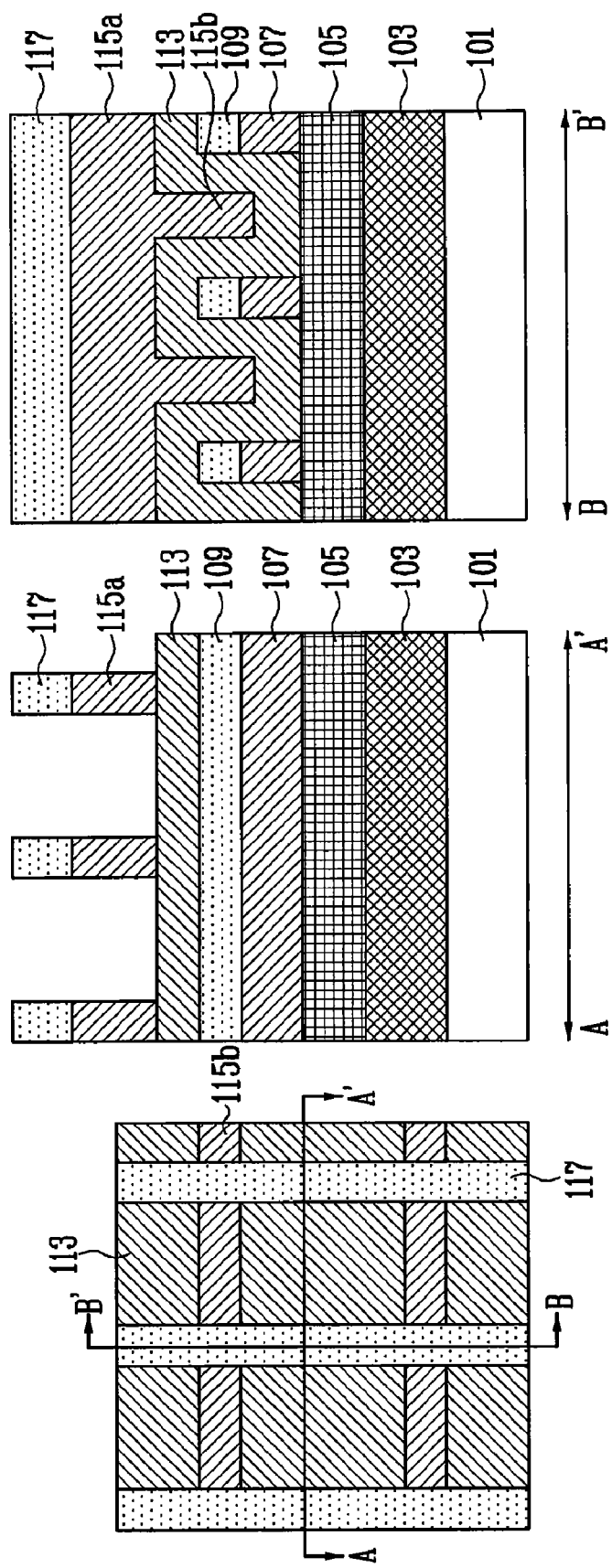

Referring to FIG. 1E, the second anti-reflection layer 117 and the third etching mask layer 115 are patterned through an etching process using the second photoresist patterns 119 to form third etching mask patterns 115a, 115b. The second photoresist patterns 119 are then removed.

The third etching mask patterns 115a, 115b comprise first patterns 115a formed on the first auxiliary layer 113 parallel to each other in a direction perpendicular to the second etching mask pattern 107 and second patterns 115b formed on the first auxiliary layer 113 between the second etching mask patterns 107 and extended parallel to the second etching mask patterns 107. A distance between the second etching mask pattern 107 and the second pattern 115b is determined by a thickness of the first auxiliary layer 113.

Specifically, according to a shape of the second photoresist pattern 119, the third etching mask layer 115 is patterned for a perpendicular direction to the second etching mask pattern 107 on the first auxiliary layer 113, thereby forming the first patterns 115a. The first patterns 115a are formed to parallel each other. A pitch between the first patterns 115a on the first auxiliary layer 113 is approximately twice as large as a pitch between the active regions AR. In addition, the third etching mask layer 115 remains on a step portion formed on the first auxiliary layer 113 between the second etching mask patterns 107. Thus, the remaining third etching mask layer becomes the second patterns 115b. The second patterns 115b are aligned and are formed on the step portion formed on the first auxiliary layer 113 such that an alignment error does not result since an exposure mask is not employed. A distance between the second pattern 115b and the second etching mask pattern 107 is determined by a thickness of the first auxiliary layer 113.

Due to the above structure, the third etching mask pattern comprises the first and second patterns 115a, 115b and exposes the first auxiliary layer 113 in the shape of square. Every square area through which the first auxiliary layer 113 is exposed includes four (4) active regions AR located at four corners of the square area, respectively.

Figure 1F:
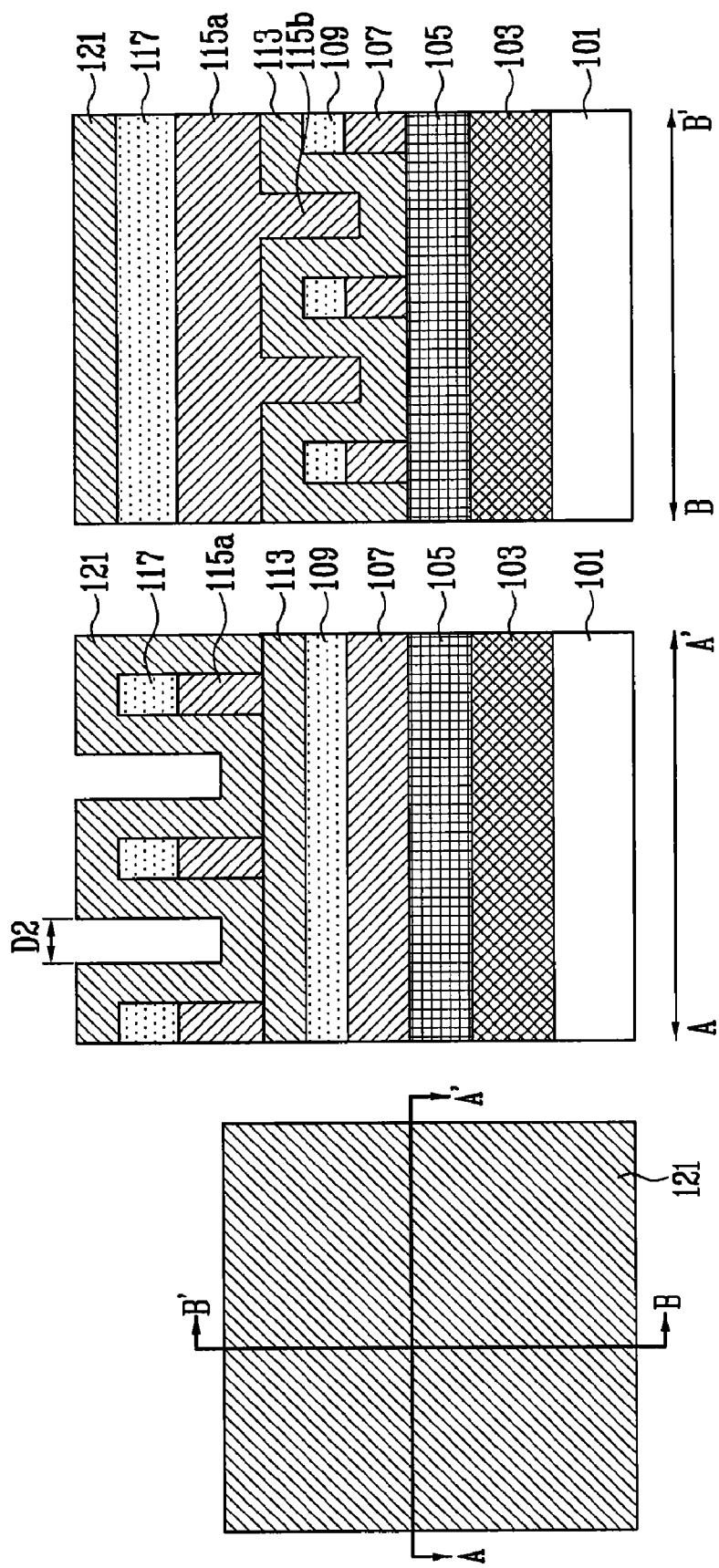

Referring to FIG. 1F, a second auxiliary layer 121 is formed over the third etching mask patterns 115a, 115b. Preferably, the second auxiliary layer 121 is formed from the same material used for forming the first auxiliary layer 113, that is, carbon polymer.

The second auxiliary layer 121 has a thickness sufficient to maintain a step formed by the first patterns 115a of the third etching mask pattern. In particular, since a thickness of the second auxiliary layer 121 formed on a side wall of the first pattern 115a of the third etching mask pattern determines a distance between the active regions in a subsequent process, it is preferable to adjust a thickness of the second auxiliary layer 121 according to a distance between the active regions. According to the second auxiliary layer 121 having a thickness sufficient to maintain the step, a trench corresponding to a width of the active region AR is formed on the second auxiliary layer 121 between the first patterns 115a of the third etching mask patterns. That is, a distance D2 between the opposite side walls of the second auxiliary layer 121 becomes a width of the active region.

Figure 1G:
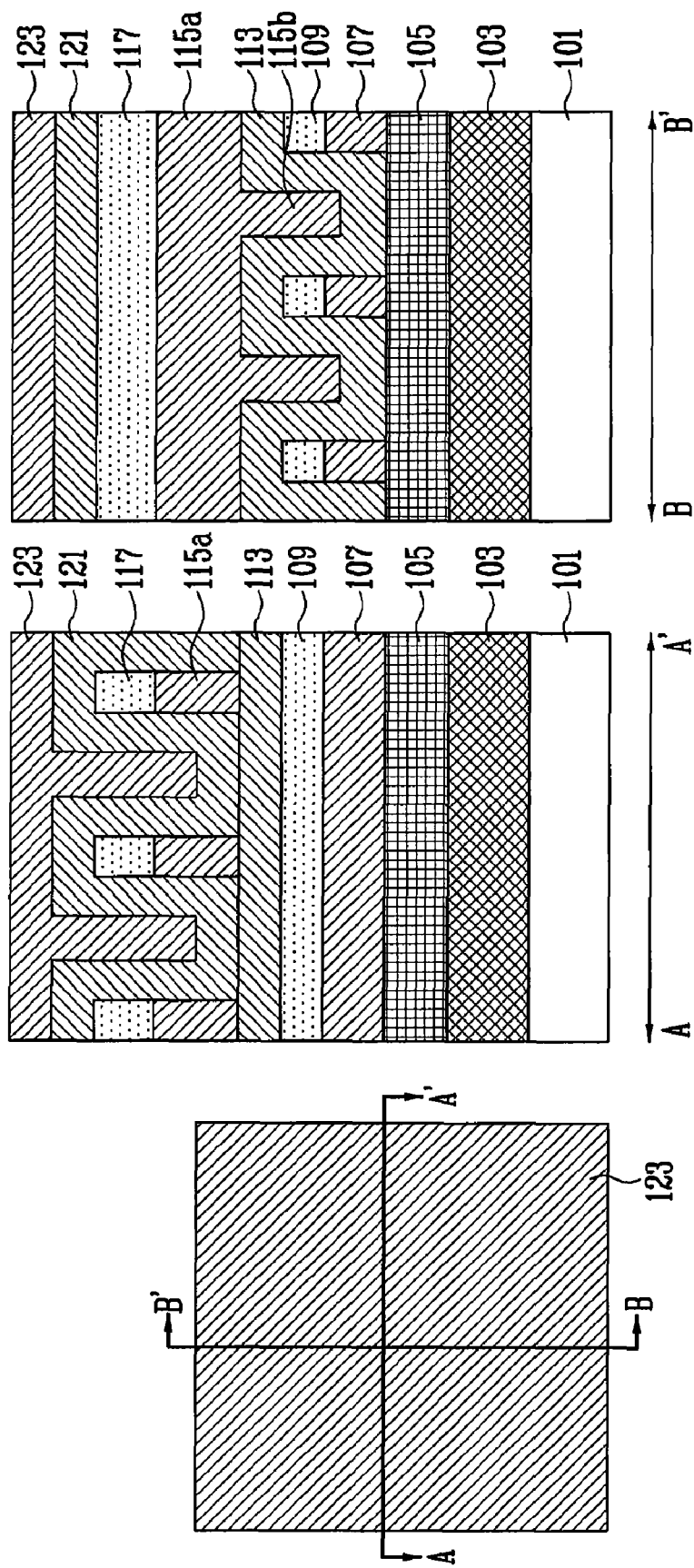

Referring to FIG. 1G, a fourth etching mask layer 123 is formed over the second auxiliary layer 121 to fill completely the step formed in the second auxiliary layer 121. To facilitate a subsequent process, it is preferable that the fourth etching mask layer 123 is formed from the same material used for forming the third etching mask layer 115 or the second hard mask layer 107. That is, the fourth etching mask layer may be formed of a bottom anti-reflection coating (BARC) layer containing silicon (Si).

Figure 1H:
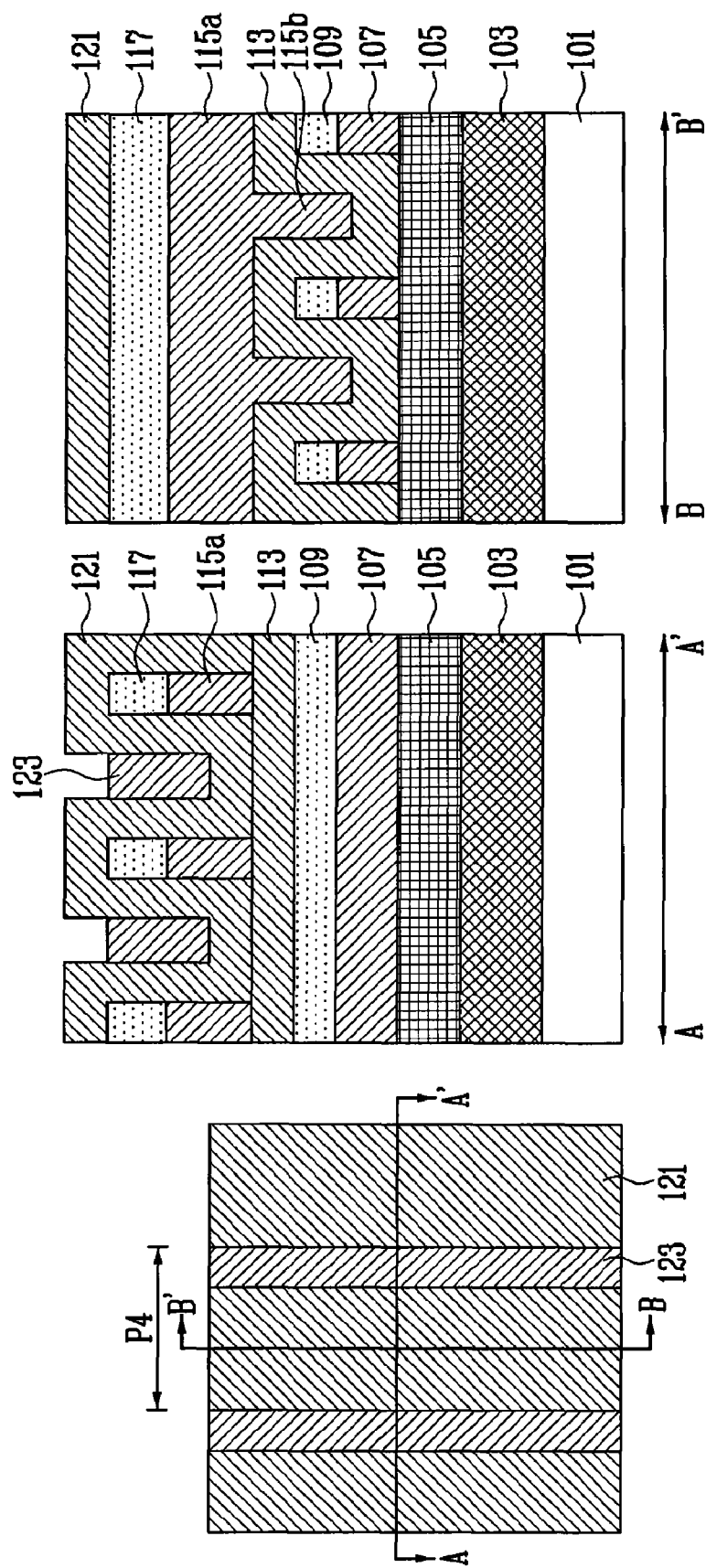

Referring to FIG. 1H, an etching process is performed such that the fourth etching mask layer may remain on only the step portion formed on the second auxiliary layer 121 to form fourth etching mask patterns 123. Due to the second auxiliary layer 121, the fourth etching mask patterns 123 are formed as a layer which differs from a layer formed by the third etching mask patterns 115a, 115b. The fourth etching mask pattern 123 is formed between the first patterns 115a of the third etching mask patterns in a direction parallel to the first patterns 115a. A pitch P4 between the fourth etching mask patterns 123 is approximately twice as large as the pitch P1 between the active regions AR. A distance between the fourth etching mask pattern 123 and the first pattern 115a of the third etching mask pattern is determined by a thickness of the second auxiliary layer 121.

The etching process can be performed by a chemical mechanical polishing process that is performed until the second auxiliary layer 121 is exposed. In addition, the etching process can be performed in a blanket etching manner such as by an etch-back process.

Figure 1I:
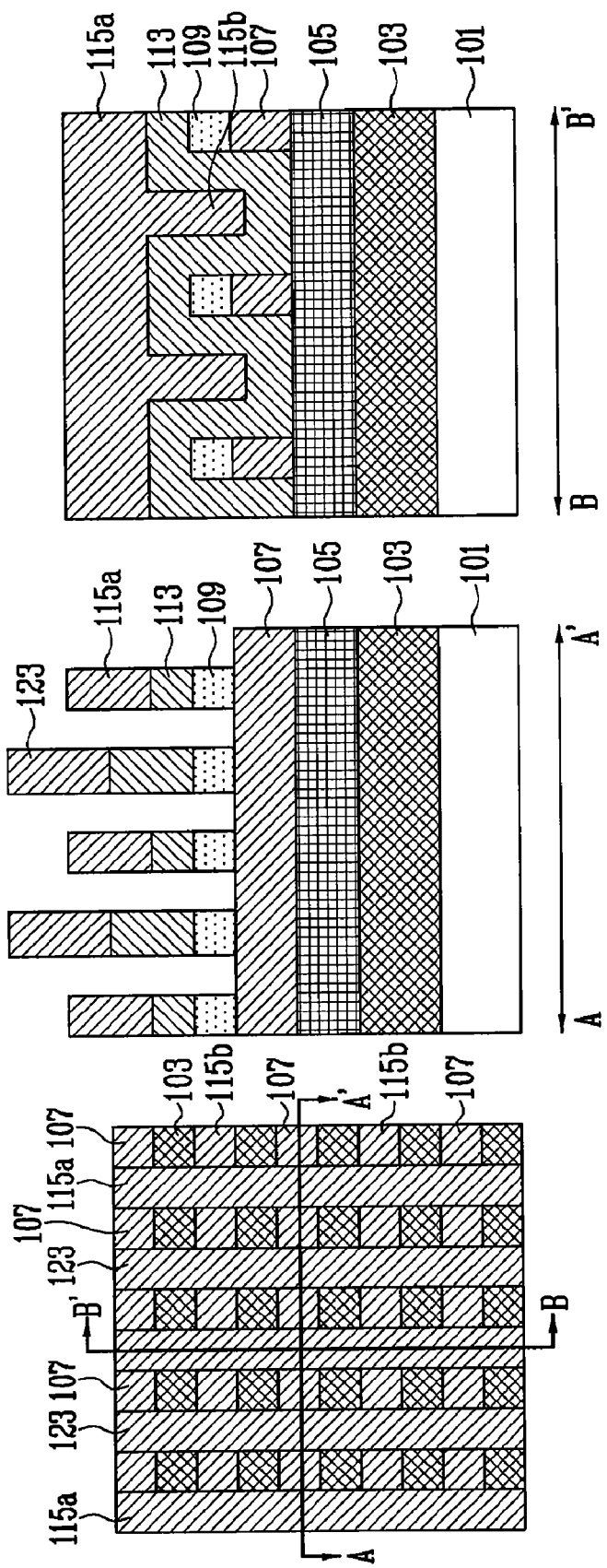
Figure 1J:
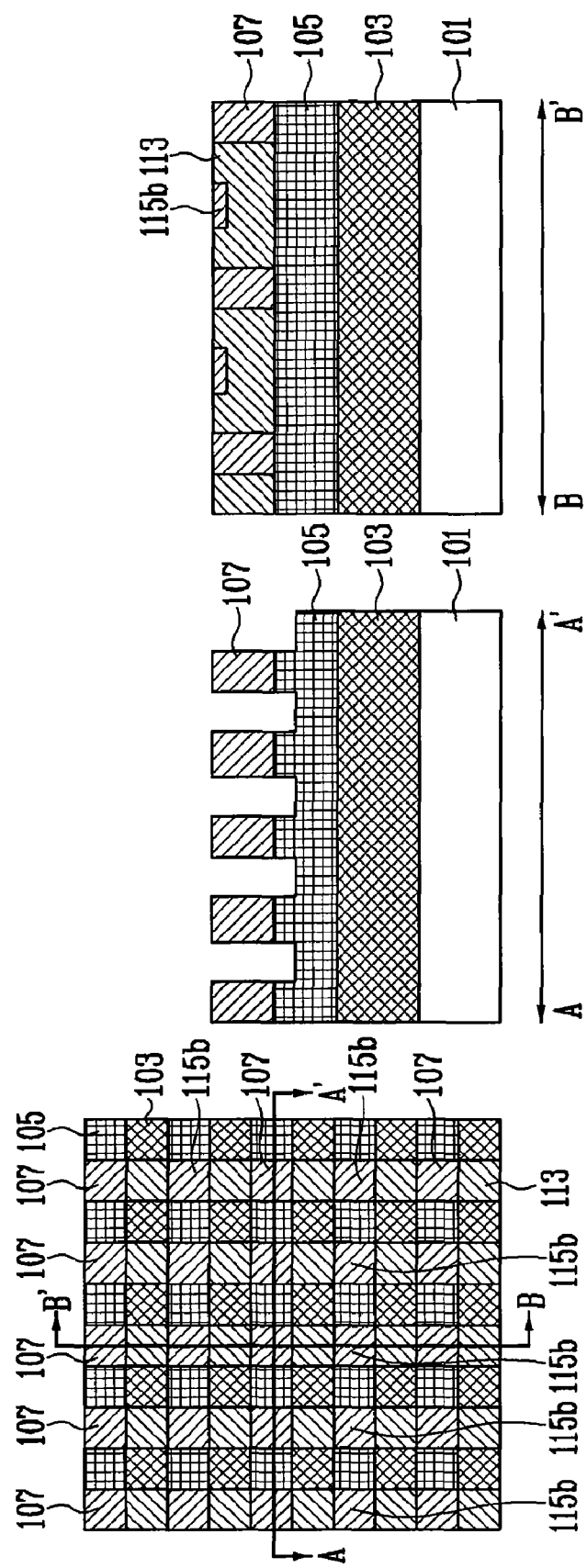

Referring to FIG. 1I, the first auxiliary layer 113 and the second auxiliary layer 121 are etched such that the first auxiliary layer 113 and the second auxiliary layer 121 remain on only a lower portion of the second, third and fourth hard mask patterns 107, 115a, 115b, 123. The first etching mask layer 105 exposed by removing both the first auxiliary layer 113 and the second auxiliary layer 121 is etched to form first etching mask patterns 105. Due to the above structure, the hard mask layer 103 is exposed between the first etching mask patterns 105.

Referring to FIG. 13, an etch-back process is performed until the second etching mask patterns 107 below the first auxiliary layer 113 are exposed. The fourth etching mask patterns 123 and the first pattern 115a of the third etching mask patterns are removed by the etch-back process. In the third etching mask patterns, the second patterns 115b form a layer which is below the layer formed by the first patterns 115a. Thus, although the first patterns 115a are removed, some of the second patterns 115b remain.

The above process will now be described more concretely. The second etching mask patterns 107 remain only on areas at which the fourth etching mask patterns 123 intersect the second etching mask patterns 107, and the second patterns 115b remain only on areas at which the first patterns 115a and the second patterns 115b of the third etching mask pattern intersect each other. As a result, the second patterns 115b of the third etching mask patterns and the second etching mask patterns 107 are separated and remain on the active regions AR in the form of a matrix. Some of the first auxiliary layer 113 remains between the second pattern 115b of the third etching mask patterns and the second etching mask pattern 107.

Referring to FIG. 1K, the first auxiliary layer 113 and the first etching mask layer 105 between the second etching mask pattern 107 and the second pattern 115b are etched through an etching process using the second etching mask patterns 107 and the second patterns 115b as the etching mask. The first etching mask layer 105 remaining only on the active region AR becomes the first etching mask patterns 105 through the etching process. Accordingly, a space between the first etching mask patterns 105 acts as an isolation area and the hard mask layer 103 is exposed between the first etching mask patterns 105.

Referring to FIG. 1L, an exposed portion of the hard mask layer 103 is removed through an etching process. By the above step, an isolation area of the semiconductor substrate 101 is exposed. Although not shown in the drawings, the exposed isolation area of the semiconductor substrate 101 is etched to form a trench. The trench is then filled with insulating material to form an isolation layer.

The processes for forming the auxiliary layers 113, 121 including carbon polymer, the etching mask layers 105, 107, 115, 123 including bottom anti-reflection coating (BARC) containing silicon (Si), and the anti-reflection layers 109, 117 or the processes for etching the above mentioned layers may be performed in an in-situ manner which is continuously performed in the same chamber under a continuous vacuum state.

The structure in which the first etching mask layer 105 is formed is described as one example. However, the hard mask layer 103 may be patterned through an etching process utilizing the second etching mask pattern 107 and the second pattern 115b without forming the first etching mask layer 105.

The first and second photoresist patterns 111, 119 utilized for forming the etching mask patterns 107, 115a, 115b, 123 having the above structure are formed through first and second exposure processes utilizing first and second exposure masks in which row directional lines and column directional lines are defined, respectively. Since a pitch of each of the above patterns is defined as a light shielding pattern (or a light-transmitting pattern) on the exposure mask, although an alignment error occurs, a pitch error of the hard mask patterns does not result. For the above reasons, if a row alignment error or a column alignment error occurs, a dimension of the active region is not changed. As a result, the problem caused by an alignment error can be solved.

Since the hard mask patterns 107, 115a, 115b, 123 are formed of the bottom anti-reflection coating (BARC) layer containing silicon (Si), a key mask opening process for exposing an overlay vernier can be omitted. That is, it is possible to simplify the process steps. Moreover, since the bottom anti-reflection coating (BARC) layer containing silicon (Si) is formed in a spin on manner, there is an advantage that the second and third hard mask patterns 115a, 115b, 123 can be easily formed in a space between the first and second auxiliary layers. In particular, as compared with a chemical vapor deposition (CVD) method or a physical vapor deposition (PVD) method, the spin on method is preformed at a low temperature (for example, room temperature). Thus, it is possible to minimize a thermal load exerted on lower components which are already formed in a process of forming the hard mask patterns.

In a case where the hard mask patterns 107, 115a, 115b, 123 are formed of the bottom anti-reflection coating (BARC) layer containing silicon (Si) and the auxiliary layers 113, 121 are formed from carbon polymer, all of the above patterns and layers contain a carbon component. Once the auxiliary layers 113, 121 are removed through an oxygen ($O_2$) plasma etching process, oxygen ($O_2$) reacts with silicon (Si) contained in the hard mask patterns to form silicon oxide ($SiO_2$) acting as an etching barrier. Accordingly, an etching selection ratio between the hard mask pattern and the auxiliary layer is increased.

It will be apparent that the method of forming the hard mask pattern as described above is applicable to a process for defining the active region as well as any process requiring the hard mask pattern having a matrix shape.

In a conventional method for defining active regions arranged in a matrix, an exposing process is performed utilizing a first mask for defining active regions positioned at odd numbered columns and odd numbered rows and a second mask for defining active regions positioned at even numbered columns and even numbered rows. Accordingly, since two masks are used in the exposing process, an alignment error may result. In the present invention, however, since the hard mask patterns used for defining the active region are formed through the row directional and column directional patterning processes, it is possible to solve the alignment error problems.

In addition, in order to embody a contact array in the dynamic random access memory (DRAM) through conventional double expose and etch technology (DEET), the mask should be separated into two sheets in the form of a checker board. To define a checker board type of contact array using exposure equipment, an illumination having a two dimensional symmetrical structure should be utilized so that a resolution is lowered. Due to the above limitation, a resolution index (k1) which can be obtained through the double expose and etch technology (DEET) is more than 0.2. In the present invention, however, the line is defined by means of the exposure equipment such that an intense illumination such as a dipole can be applied to achieve a resolution index (k1) of up to 0.14.

Although the present invention has been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a hard mask pattern in a semiconductor device, the method comprising:
    forming first etching mask patterns over a hard mask layer formed on a semiconductor substrate;
    forming second etching mask patterns including first patterns and second patterns over the semiconductor substrate, the first patterns intersecting the first etching mask patterns, each second pattern being disposed between the first etching mask patterns;
    forming third etching mask patterns over the semiconductor substrate after forming the second etching mask patterns including the first patterns and the second patterns, each third etching mask pattern being disposed between the first patterns and intersecting the first etching mask patterns;
    performing a first etching process such that the first etching mask patterns remain on regions at which the first patterns intersect the first etching mask patterns and the second patterns remain on regions at which the first patterns intersect the second patterns; and
    patterning the hard mask layer through a second etching process utilizing the remaining first etching mask patterns and the second patterns as an etching mask to form hard mask patterns.

2. The method of claim 1, wherein the first, second and third etching mask patterns are formed from the same material.

3. The method of claim 2, wherein the first, second and the third etching mask patterns are formed of a bottom anti-reflection coating (BARC) layer containing silicon (Si).

4. The method of claim 1, wherein the first, second and third etching mask patterns are separately formed on different layers.

5. The method of claim 4, wherein the first patterns and the second patterns of the second etching mask pattern are formed on different layers.

6. The method of claim 1, wherein the step of forming the second etching mask patterns comprises:
    forming a first auxiliary layer with a thickness sufficient to maintain a stepped portion formed by the first etching mask patterns;
    forming an etching mask layer over the first auxiliary layer to fill a space between the first auxiliary patterns formed by the stepped portion; and
    performing a patterning process such that the etching mask layer remains in the space between the first auxiliary layers and the second etching mask layer intersects the first etching mask patterns and remains on the first auxiliary layer to form the first and second patterns.

7. The method of claim 6, wherein the first auxiliary layer comprises carbon polymer.

8. The method of claim 6, further comprising forming an anti-reflection layer over the etching mask layer.

9. The method of claim 6, wherein a distance between the first etching mask pattern and the second pattern is determined by a thickness of the first auxiliary layer.

10. The method of claim 1, wherein forming the third etching mask patterns comprises:
   forming a second auxiliary layer with a thickness sufficient to maintain a stepped portion formed by the second etching mask patterns;
   forming an etching mask layer over the second auxiliary layer to fill a space between the second auxiliary patterns formed by the stepped portion; and
   performing a patterning process such that the etching mask layer remains in the space between the second auxiliary layers to form the third etching mask patterns.

11. The method of claim 10, wherein the second auxiliary layer comprises carbon polymer.

12. The method of claim 10, wherein a distance between the first pattern and the third hard mask pattern is determined by a thickness of the second auxiliary layer.

13. The method of claim 1, wherein the regions on which the hard mask patterns are active regions.

14. The method of claim 13, wherein the first etching mask patterns are formed parallel to each other on the active regions and are located at odd-numbered columns or rows or at even-numbered columns or rows in the active regions.

15. The method of claim 13, wherein the first etching mask patterns have a pitch which is approximately twice as large as a pitch between the active regions.

16. The method of claim 13, wherein the first patterns have a pitch which is approximately twice as large as a pitch between the active regions.

17. The method of claim 13, wherein the second patterns have a pitch which is approximately twice as large as a pitch between the active regions.

18. The method of claim 13, wherein the third hard mask patterns have a pitch which is approximately twice as large as a pitch between the active regions.

19. The method of claim 1, wherein the first, second and third etching mask patterns are formed in the same chamber in an in-situ manner.

20. The method of claim 1, wherein the third etching mask patterns and the first patterns are removed by a first etching process.

21. A method of forming a hard mask pattern in a semiconductor device, the method comprising;
   forming a first etching mask patterns over a hard mask layer provided on a semiconductor substrate;
   forming second etching mask patterns over the semiconductor substrate such that each second etching mask pattern is disposed between the first etching mask patterns, wherein each second etching mask pattern comprises a first pattern and a second pattern, the first patterns intersecting the first etching mask patterns;
   forming third etching mask patterns over the semiconductor substrate after forming the second etching mask patterns including the first patterns and the second patterns, wherein each third etching mask pattern is disposed between the first patterns and intersects the first etching mask patterns;
   performing first etching the first etching mask patterns and the second patterns such that the first etching mask patterns remain on regions at which the first patterns intersect the first etching mask patterns and the second patterns remain on regions at which the first patterns intersect the second patterns; and
   performing second etching utilizing the first etching mask patterns and the second patterns as an etching mask to form hard mask patterns, wherein the hard mask patterns correspond to active regions of the semiconductor substrate, the active regions being arranged in a matrix shape.

* * * * *